US006364670B1

(12) United States Patent
Wickett et al.

(10) Patent No.: US 6,364,670 B1

(45) **Date of Patent: *Apr. 2, 2002**

(54) JUNCTION BOX HAVING FUNCTION ELECTRONICS

(75) Inventors: Paul Wickett, Northville; Mary Albrecht, Novi; Ralph K. Gordinier, Wixom; Ron Moore, Troy; Timothy Frasier, Grosse Pointe; John Casari, Manchester; Paul Janos, West Bloomfield, all of MI (US); David M. Fornaro, Annapolis, MD (US)

(73) Assignee: Robert Bosch Corporation, Broadview, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/193,978

(22) Filed: Nov. 18, 1998

(51) Int. Cl.[7] .................................................. H05K 1/00

(52) U.S. Cl. ...................................... 439/76.2; 439/949

(58) Field of Search .............................. 439/76.2, 76.1, 439/949, 67, 77

(56) References Cited

U.S. PATENT DOCUMENTS

| | | | | |
|---|---|---|---|---|
| 4,897,042 A | | 1/1990 | Saka et al. | |
| 4,944,684 A | * | 7/1990 | Leibowitz | 439/76.2 |
| 4,978,638 A | * | 12/1990 | Buller | 437/209 |
| 5,023,752 A | | 6/1991 | Detter et al. | |
| 5,067,905 A | | 11/1991 | Matsumoto et al. | |
| 5,204,805 A | | 4/1993 | Takahashi et al. | |
| 5,285,011 A | | 2/1994 | Shimochi | |
| 5,407,622 A | | 4/1995 | Cleveland et al. | |
| 5,415,559 A | | 5/1995 | Ichimura | |
| 5,445,526 A | | 8/1995 | Hoshino et al. | |
| 5,460,531 A | | 10/1995 | Vivio | |
| 5,622,506 A | | 4/1997 | Hornig et al. | |
| 5,709,567 A | | 1/1998 | Gladd et al. | |
| 5,749,739 A | | 5/1998 | Saka et al. | |
| 5,755,579 A | | 5/1998 | Yanase et al. | |
| 5,761,046 A | * | 6/1998 | Hein et al. | 361/752 |
| 5,764,487 A | | 6/1998 | Natsume | |
| 5,995,380 A | * | 11/1999 | Maue et al. | 361/826 |

* cited by examiner

*Primary Examiner*—P. Austin Bradley
*Assistant Examiner*—Ross Gushi
(74) *Attorney, Agent, or Firm*—Greer, Burns & Crain, Ltd.

(57) ABSTRACT

An electric junction box is adapted to minimize the number of necessary components. It includes a first part having a first side including a plurality of integrally formed first connectors and a second side arranged and configured to receive at least one of a fuse and/or a relay. A second part has a first side arranged and configured to receive at least one external connector and a second side having a plurality of integrally formed second connectors. At least one intermediate part is disposed between the first part and the second part. It has a first side including a plurality of integrally formed first interconnecting means for engaging the first connectors of the first part, and a second side having a plurality of integrally formed second interconnecting means for engaging the second connectors of the second part.

20 Claims, 3 Drawing Sheets

JUNCTION BOX HAVING FUNCTION ELECTRONICS

The present invention generally relates to electrical junction boxes, and more particularly to an electrical junction box having electronics for performing various functions.

Conventionally, electrical junction boxes used in motor vehicles are generally utilized as an electrical signal distribution center for generic electronic module (GEM) which perform various necessary functions in an electrical system, such as a security function or a door chime function in an automobile or other motor vehicles, for example. The junction boxes and the GEM are normally implemented as separate units and are electrically connected together by connectors such as wiring harnesses that carry a large number of wire conductors. Often the junction boxes and the GEM may be separated by a relatively significant distance due to the physical layout of the motor vehicles that utilize these components, thereby requiring longer connectors. Consequently, these connectors complicate the electrical system of the device and also add to the overall cost of manufacture.

Therefore, it is desirable to consolidate the junction box and the GEM into a single unit, i.e., incorporate the GEM into the junction box. One problem of simply housing the GEM in the junction box is that the junction box carries high current, which creates a high thermal power density within the junction box and interferes with the proper operation of the GEM, which operates at a much lower current than the junction box. Another problem is the high material cost and manufacturing complexity involved in consolidating a large number of components of the junction box and the function electronics. This problem is compounded by the fact that the users, typically original equipment manufacturing engineers, of such a combined junction box generally desire that the junction box be packaged into a smaller and lighter assembly.

Accordingly, it is a primary objective of the present invention to provide an improved junction box adapted to incorporate function electronics into its housing.

Another object of the present invention to provide such an improved junction box which directs heat away from the function electronics.

Still another object of the present invention is to provide such an improved junction box which requires minimal number of parts.

Yet another object of the present invention is to provide such an improved junction box having molded three-dimensional electrical circuits.

Other objects and advantages will become apparent upon reading the following detailed description, in conjunction with the attached drawings, in which.

DETAILED DESCRIPTION

The present invention is directed to a junction box having molded three-dimensional electrical circuits and adapted to incorporate function electronics into the junction box. Broadly stated, the present invention is directed to an electrical junction box which is adapted to minimize the number of necessary components. It includes a first part having a first side including a plurality of integrally formed first connectors and a second side arranged and configured to receive at least one of a fuse and/or a relay. A second part has a first side arranged and configured to receive at least one external connector and a second side having a plurality of integrally formed second connectors. At least one intermediate part is disposed between the first part and the second part, and has a first side including a plurality of integrally formed first interconnecting means for engaging the first connectors of the first part, and a second side having a plurality of integrally formed second interconnector means for engaging the second connectors of the second part.

The invention is also directed to a junction box which incorporates electronics for performing various functions into its housing. It includes a first part for receiving at least one of a fuse and/or a relay, and an intermediate part configured to be mated to the first part and electrically connected to the at least one of the fuse and/or the relay. Also included is a second part which is configured to be mated to the intermediate part and adapted to electrically connect the fuse and/or the relay to a corresponding external connector via the intermediate part. The second part has a ledge integrally formed on an inside thereof and a heat sink integrally formed on an outside thereof. The electronics for performing the function are disposed between the intermediate part and the second part and thermally attached to the integral ledge, so that heat built-up on the function electronics is released through the integral heat sink.

Figure 1:
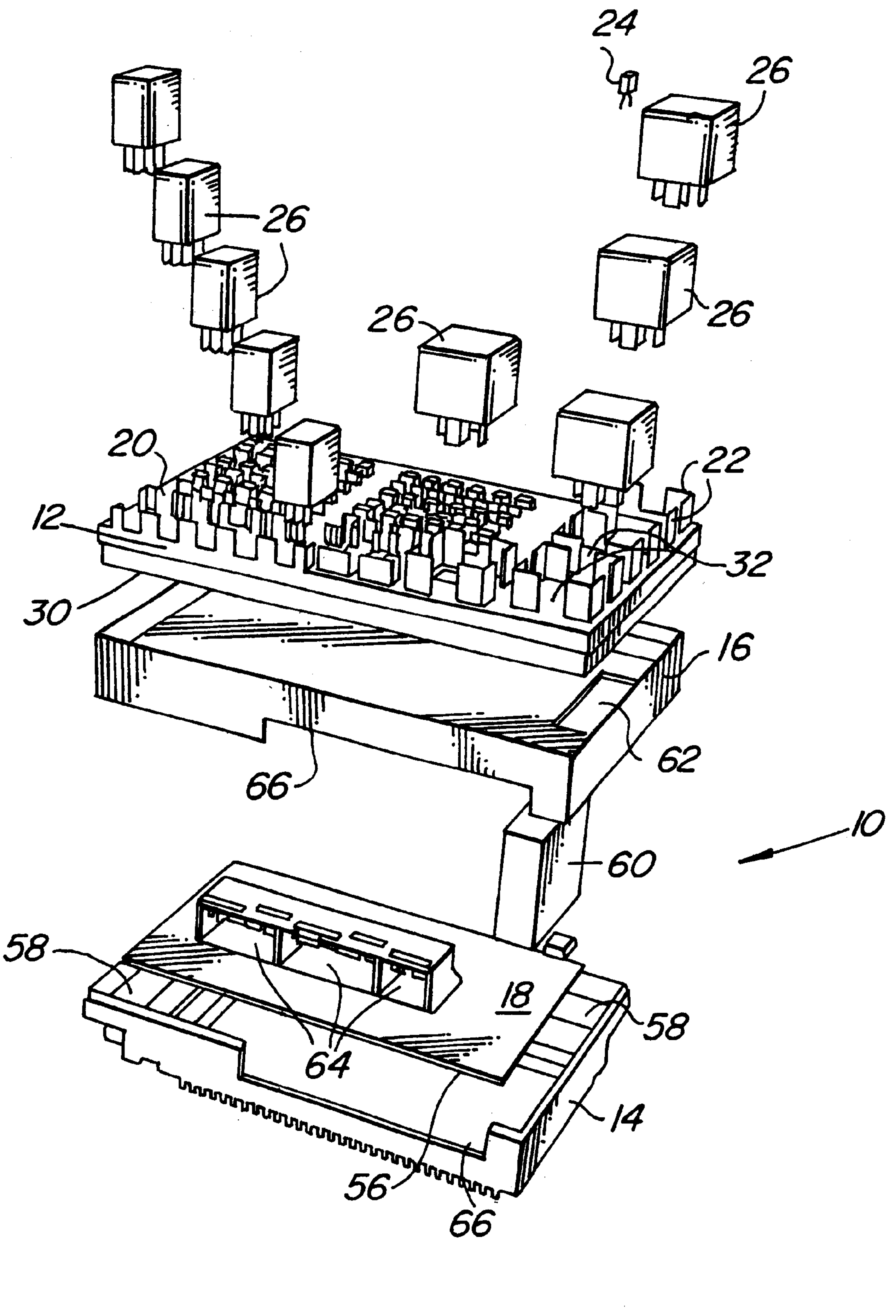
FIG. 1 is an exploded perspective view showing a top, a bottom and an intermediate parts of a junction box embodying the present invention.
Figure 2:
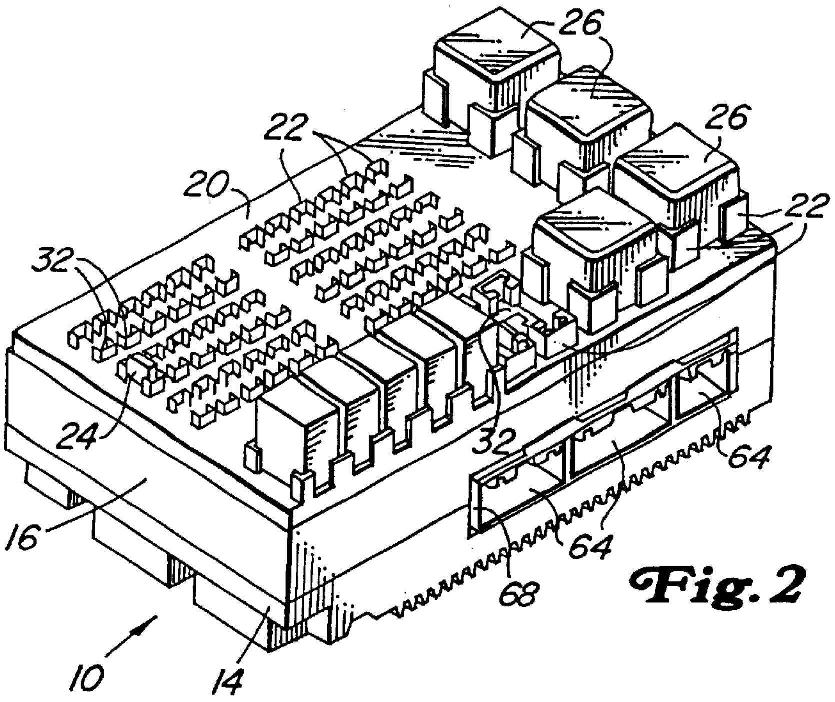
FIG. 2 is an assembled perspective view of the junction box of FIG. 1.

Turning now to FIGS. 1 and 2, the junction box of the present invention is indicated generally at 10 and includes a fuse/relay part 12, a connector part 14 and a routing part 16 disposed between the fuse/relay part and the connector part. The junction box 10 houses a generic electronic module (GEM) 18 which is provided between the routing part 16 and the connector part 14.

In accordance with one important aspect of the present invention, the fuse/relay part 12, the connector part 14 and the routing part 16 are produced generally through a process known as a molded interconnect technology (MIT), which is disclosed in detail in U.S. Pat. No. 5,407,622 to Cleveland et al. Briefly, these parts 12, 14, 16 are produced by first injection molding a platable resin to form desired circuit patterns, which are raised relative to a generally flat base. Then a non-platable resin is molded onto the base and around the raised circuits, thereby keeping the circuit patterns exposed. The exposed circuit patterns are then plated with copper to the desired thickness. Thus, the parts 12, 14, 16 of the junction box 10 are, in effect, three-dimensional electrical circuits.

The fuse/relay part 12 has a top side 20 which has a plurality of shrouds 22 configured to receive corresponding fuses 24 or relays 26 (best shown in FIG. 2). The shrouds 22 are integrally formed on the fuse/relay part 12 during the MIT molding process. The fuses 24 and the relays 26 become electrically connected to the corresponding plurality of male connectors 28 (shown in FIGS. 3 and 4) protruding from the bottom side 30 of the fuse/relay part 12, via electrical circuit 31 partially imbedded in the fuse/relay part (best shown in FIGS. 3 and 4), when the fuses and the relays are plugged into their respective receptacles 32 on the top side 20 (best shown in FIG. 2). Thus, the present fuse/relay part 12 advantageously incorporates all the components in a junction box typically required for receiving the fuses and the relays (i.e., a plurality of shrouds, receptacles, electrical circuits and connector pins) into a single integrated piece.

Figure 3:
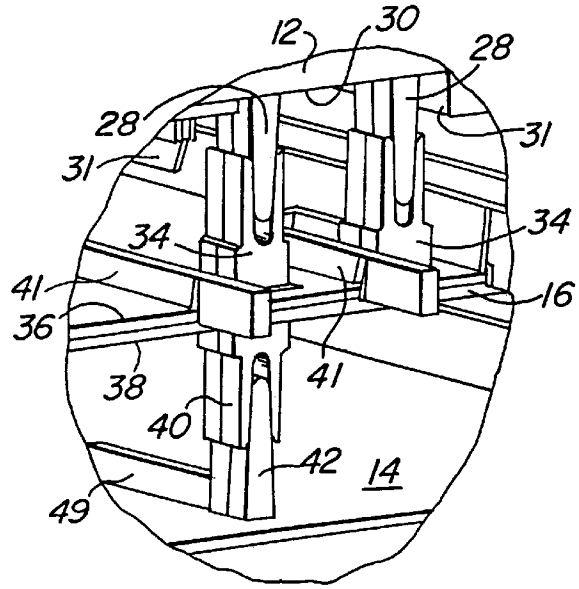
FIG. 3 is an enlarged perspective view of pin structures for interconnecting the top, the intermediate and the bottom parts of the junction box of FIG. 1.
Figure 4:
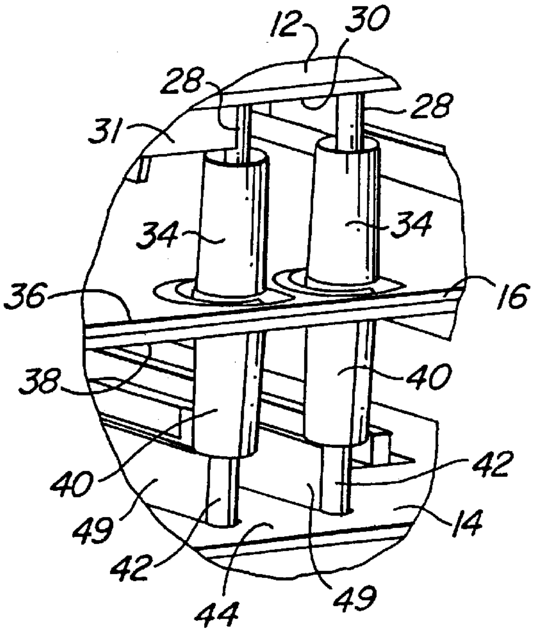
FIG. 4 is an enlarged view of another embodiment of a pin structure for interconnecting the top, the intermediate and the bottom parts of the junction box of FIG. 1.

The routing part 16 is configured to be attached to the fuse/relay part 12. Its primary function is to electrically connect the fuses and/or relays on the fuse/relay part to the connector part 14. To this end, the routing part 16 includes a plurality of female connectors 34 on the top side 36 thereof. These female connectors 34 are configured to engage the male connectors 28 of the fuse/relay part 12 (shown in FIGS. 3 and 4). Turning now to FIGS. 3 and 4, the male connectors 28 of the fuse/relay part 12 depend from the bottom side 30 thereof and engage the corresponding female connectors 34 of the routing part 16. In one embodiment, the male connectors 28 are generally flat pins which are configured to engage the female connectors 34 having a generally U-shaped slot for receiving the male connectors (best shown in FIG. 3). In another embodiment, the male connectors 28 are cylindrical pins which are configured to engage the generally cylindrically tube-shaped female connectors 34 (best shown in FIG. 4).

As on the top side 36, the bottom side 38 of the routing part 16 also includes a plurality of female connectors 40 which are configured to engage the male connectors 42 of the connector part 14. The female connectors 40 on the bottom side 38 are directly connected to the female connectors 34 on the top side 36 through the routing part 16 (best shown in FIG. 4), or are connected via electrical circuit 41 partially embedded in the routing part (best shown in FIG. 3). Thus, the routing part 16 is adapted to electrically connect the fuse/relay 12 to the connector part 14 when their respective male and female connectors 28, 34, 40 are interconnected.

It should be noted that while the routing part 16 is shown as being a single piece in FIG. 1, more than one routing part can be used to electrically connect the fuse/relay 12 to the connector part 14, if necessary. Similar to the fuse/relay part 12, an important feature of the routing part 16 is that it incorporates multiple components, including the plurality of female connectors 34, 40 and the electrical circuits 41 into a single integrated piece, thereby significantly simplifying the manner in which the fuse/relay part 12 is interconnected with the connector part 14 of the junction box 10.

Referring still to FIGS. 3 and 4, the male connectors 42 of the connector part 14 are located on the inside 44 thereof. They are generally the same as the male connectors 28 described above with respect to the fuse/relay part 12 and correspondingly engage the female connectors 40 on the bottom side 38 of the routing part 16. The male connectors 42 are electrically connected to a plurality of terminal pins and/or receptacles 46 on the outside 48 (best shown in FIG. 5) of the connector part 14 via electrical circuits 49 partially embedded within the connector part 14 during the production process employing the molded interconnect technology (MIT).

Figure 5:
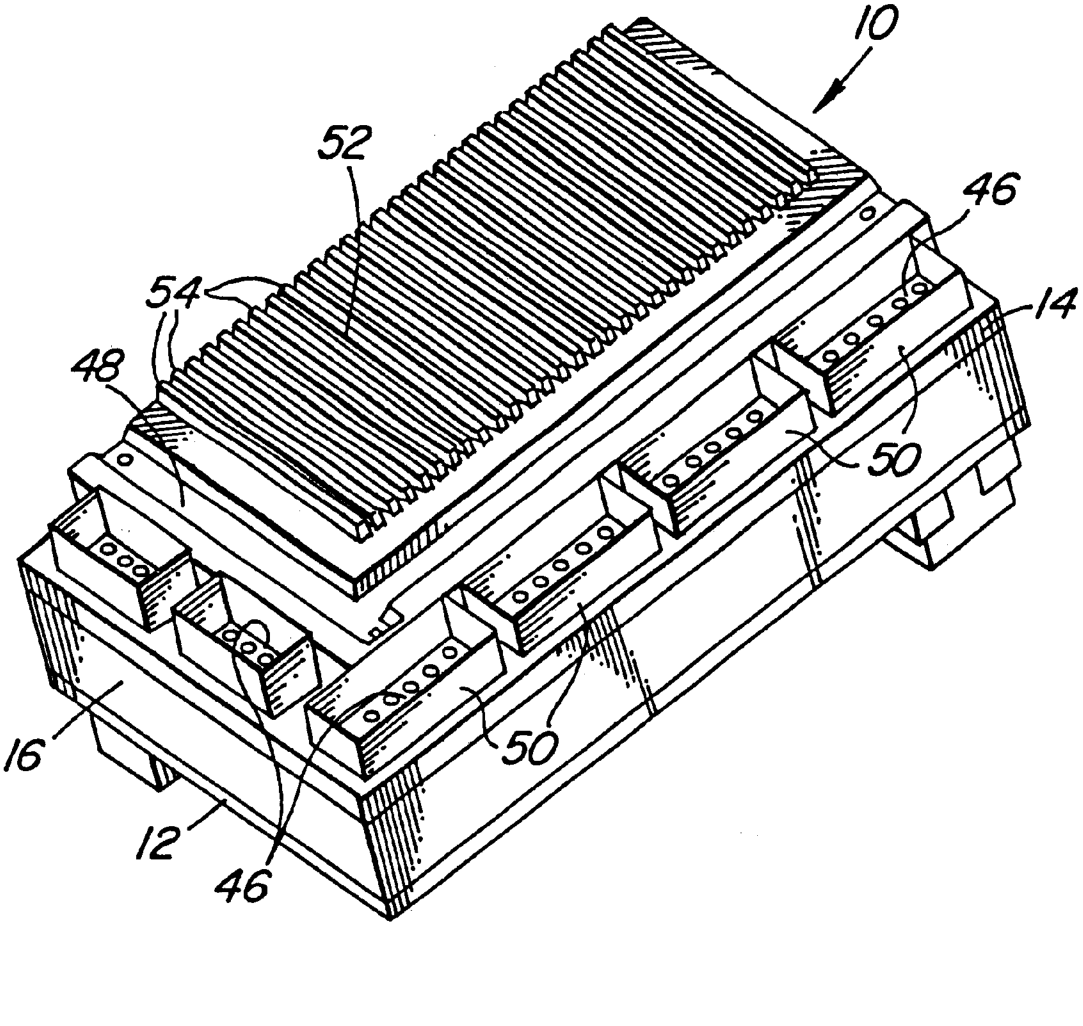
FIG. 5 is a bottom perspective view of the junction box of FIG. 2.

Turning now to FIG. 5, the terminal pins and/or receptacles 46 on the outside 48 of the connector part 14 are enclosed within several shrouds 50. The shrouds 50 are integrally formed on the connector part 14 and serve to assist external connectors (not shown) in making electrical connection with the terminal pins and/or receptacles 46. In accordance with an important feature of the invention, the connector part 14 is provided with a heat sink 52 which is integrally formed on the connector part during the MIT manufacturing process. The heat sink 52 has a plurality of fins 54 which are configured and adapted to release heat generated within the junction box via thermal conduction.

Turning back to FIG. 1, the generic electronic module (GEM) 18 is preferably implemented on a printed circuit board (PCB) 56, but may also be provided on a flexible circuit board or a ceramic substrate, as well. The PCB 56 is disposed between the routing part 16 and the connector part 14, and rests directly atop a ledge 58 on the inside 44 of the connector part. It should be noted that the ledge 58 is integrally formed on the connector part 14, so that heat built-up on the PCB 56 can be channeled away to the heat sink 52 and dissipated. Electrical connections between the GEM 18 and the fuse/relay part 12 are made through a plug 60 which extends through an opening 62 in the routing part 16. Electrical connections to the external devices (not shown), the functions of which the GEM controls, are made via a plurality of function receptacles 64. To facilitate the connection between receptacles 64 and the external devices, the routing part 16 and the connector part 14 have cut-out sections 66 which form a generally rectangular opening 68 when these parts are put together (best shown in FIG. 2).

From the foregoing description, it should be understood that an improved junction box has been shown and described which has many desirable attributes and advantages. Using the molded interconnect technology (MIT), the number of the basic components of the junction box has been reduced to three, including the heat sink for protecting the GEM from high thermal density inside the junction box.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. An electrical junction box adapted to minimize the number of necessary components thereof, comprising:

a first part having a first side including a plurality of first connecting means formed into a single integrated piece with and protruding from said first side, and a second side arranged and configured to receive at least one of a fuse and/or a relay;

a second part having a first side arranged and configured to receive at least one external connector and a second side having a plurality of second connecting means formed into a single integrated piece with and protruding from said second side of said second part;

at least one intermediate part disposed between said first part and said second part and having a first side including a plurality of first interconnecting means formed into a single integrated piece with said first side of said intermediate part for engaging said first connecting means of said first part, and a second side having a plurality of second interconnecting means formed into a single integrated piece with said second side of said intermediate part for engaging said second connecting means of said second part; and, at least one generic electronic module disposed between said intermediate part and said second part.

2. The junction box as defined in claim 1 wherein said plurality of said first connecting means of said first part are male connectors and said plurality of said first interconnecting means of said at least one intermediate part are female connectors.

3. The junction box as defined in claim 1 wherein said plurality of said second connecting means of said second part are male connectors and said plurality of said second interconnecting means of said at least one intermediate part are female connectors.

4. The junction box as defined in claim 1 wherein said intermediate part includes an integrally formed electric circuit for electrically connecting said plurality of said first interconnecting means of said intermediate part to said plurality of said second interconnecting means of said intermediate part.

5. The junction box as defined in claim 1 wherein said first part is integrally formed through molded interconnect technology.

6. The junction box as defined in claim 1 wherein said second part is integrally formed through molded interconnect technology.

7. The junction box as defined in claim 1 wherein said intermediate part is integrally formed through molded interconnect technology.

8. The junction box as defined in claim 1 wherein said generic electronic module is electrically connected to said first part via a plug which extends through an opening in said intermediate part.

9. The junction box as defined in claim 1 wherein said generic electronic module is attached to a heat sink integrally formed on the first side of said second part.

10. The junction box as defined in claim 1 wherein said second side of said first part includes at least one integrally formed receptacle for receiving said at least one of said fuse and/or said relay.

11. The junction box as defined in claim 10 wherein said second side of said first part further includes at least one shroud integrally formed around said receptacle for guiding said at least one of said fuse and/or said relay into said receptacle.

12. The junction box as defined in claim 10 wherein said first part further includes an integrally formed electric circuit for electrically connecting said at least one receptacle formed on said second side of said first part to at least one corresponding said plurality of first connecting means formed on said first side of said first part.

13. The junction box as defined in claim 1 wherein said first side of said second part includes at least one integrally formed receptacle for receiving said at least one external connector.

14. The junction box as defined in claim 13 wherein said first side of said second part further includes at least one shroud integrally formed around said receptacle for guiding said at least one external connector into said receptacle.

15. The junction box as defined in claim 13 wherein said second part further includes an integrally formed electric circuit for electrically connecting said at least one receptacle formed on said first side of said second part to at least one corresponding said plurality of second connecting means formed on said second side of said second part.

16. The junction box as defined in claim 1 wherein said first side of said second part further includes an integrally formed heat sink.

17. The junction box as defined in claim 16 wherein said heat sink is a plurality of fins.

18. A junction box adapted to incorporate function electronics, comprising:

a first part for receiving at least one of a fuse and/or a relay;

an intermediate part configured to be mated to said first part and electrically connected to said at least one of said fuse and/or said relay; and a second part configured to be mated to said intermediate part and adapted to electrically connect said fuse and/or said relay to a corresponding external connector via said intermediate part, said second part having a ledge integrally formed on an inside thereof and a heat sink integrally formed on an outside thereof;

wherein the function electronics are disposed between said intermediate part and said second part and thermally attached to said integral ledge, so that heat built-up on the function electronic is released through said integral heat sink.

19. The junction box as defined in claim 18 wherein said heat sink is a plurality of fins.

20. An electrical junction box adapted to be used on a motor vehicle and to minimize the number of necessary components thereof, comprising:

a first part having a first side including a plurality of first connecting means formed into a single integrated piece with and protruding from said first side, and a second side arranged and configured to receive at least one of a fuse and/or a relay of the motor vehicle;

a second part having a first side arranged and configured to receive at least one wiring harness of the motor vehicle, and a second side having a plurality of second connecting means formed into a single integrated piece with and protruding from said second side of said second part;

at least one intermediate part disposed between said first part and said second part and having a first side including a plurality of first interconnecting means formed into a single integrated piece with said first side of said intermediate part for engaging said first connecting means of said first part, and a second side having a plurality of second interconnecting means formed into a single integrated piece with said second side of said intermediate part for engaging said second connecting means of said second part; and, at least one generic electronic module disposed between said intermediate part and said second part.

* * * * *

UNITED STATES PATENT AND TRADEMARK OFFICE

CERTIFICATE OF CORRECTION

PATENT NO. : 6,364,670 B1
DATED : April 2, 2002
INVENTOR(S) : Wickett et al.

It is certified that error appears in the above-identified patent and that said Letters Patent is hereby corrected as shown below:

Column 6,
Line 18, delete "integrally".
Line 19, delete "integrally"; after "thereof" insert -- , said ledge and said heat sink being formed into a single integrated piece with said second part --.
Line 22, delete "integrally".
Line 24, delete "integrally".

Signed and Sealed this

Seventeenth Day of December, 2002

JAMES E. ROGAN
*Director of the United States Patent and Trademark Office*